(12) United States Patent
Chang et al.

(10) Patent No.: US 9,837,435 B1
(45) Date of Patent: Dec. 5, 2017

(54) THREE-DIMENSIONAL NON-VOLATILE MEMORY STRUCTURE AND MANUFACTURING METHOD THEREOF

(71) Applicant: PHISON ELECTRONICS CORP., Miaoli (TW)

(72) Inventors: Chun-Yen Chang, Hsinchu County (TW); Chun-Hu Cheng, Taipei (TW); Wei Lin, Taipei (TW); Yu-Chien Chiu, Kaohsiung (TW); Chien Liu, Pingtung County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/461,478

(22) Filed: Mar. 17, 2017

(30) Foreign Application Priority Data

Jan. 20, 2017 (TW) .............................. 106102237 A (51) Int. Cl.
| | |
|---|---|
| *H01L 27/00* | (2006.01) |
| *H01L 27/11582* | (2017.01) |
| *H01L 29/792* | (2006.01) |
| *H01L 27/11568* | (2017.01) |
| *H01L 29/10* | (2006.01) |
| *H01L 27/11551* | (2017.01) |
| *H01L 21/822* | (2006.01) |
| *H01L 27/11578* | (2017.01) |
| *H01L 27/06* | (2006.01) |
| *H01L 27/11502* | (2017.01) |

(52) U.S. Cl.
CPC .... *H01L 27/11582* (2013.01); *H01L 21/8221* (2013.01); *H01L 27/0688* (2013.01); *H01L 27/11502* (2013.01); *H01L 27/11551* (2013.01); *H01L 27/11568* (2013.01); *H01L 27/11578* (2013.01); *H01L 29/1037* (2013.01); *H01L 29/7926* (2013.01)

(58) Field of Classification Search
CPC .......... H01L 27/0688; H01L 27/11502; H01L 27/11578; H01L 27/11551; H01L 21/8221
See application file for complete search history.

(56) References Cited

U.S. PATENT DOCUMENTS

| 9,209,031 B2 | 12/2015 | Baenninger et al. |
| 9,230,983 B1 | 1/2016 | Sharangpani et al. |
| 9,236,396 B1 | 1/2016 | Koka et al. |

(Continued)

OTHER PUBLICATIONS

Zhiyuan Lun et al., "Investigation of the Impact of Grain Boundary on Threshold Voltage of 3-D MLC NAND Flash Memory", Silicon Nanoelectronics Workshop , Jun. 2015, 1-2.

(Continued)

*Primary Examiner* — Ngan Ngo
(74) *Attorney, Agent, or Firm* — JCIPRNET (57) ABSTRACT

A three-dimensional non-volatile memory structure including a substrate, a stacked structure, a charge storage pillar, a channel pillar, and a ferroelectric material pillar is provided. The stacked structure is disposed on the substrate and includes a plurality of conductive layers and a plurality of first dielectric layers, and the conductive layers and the first dielectric layers are alternately stacked. The charge storage pillar is disposed in the stacked structure. The channel pillar is disposed inside the charge storage pillar. The ferroelectric material pillar is disposed inside the channel pillar.

20 Claims, 11 Drawing Sheets

(56) References Cited

U.S. PATENT DOCUMENTS

| | | | |
|---|---|---|---|
| 9,685,484 B1* | 6/2017 | Rabkin | H01L 27/2481 |
| 9,748,312 B2* | 8/2017 | Izumida | H01L 27/249 |
| 2015/0294977 A1* | 10/2015 | Kim | H01L 27/11573 |
| | | | 257/314 |
| 2015/0325290 A1* | 11/2015 | Lasser | G11C 13/0069 |
| | | | 365/148 |
| 2016/0079259 A1* | 3/2016 | Son | H01L 27/11573 |
| | | | 257/401 |
| 2016/0365133 A1* | 12/2016 | Ino | G11C 11/2273 |
| 2017/0243651 A1* | 8/2017 | Choi | G11C 16/10 |
| 2017/0243881 A1* | 8/2017 | Shin | H01L 21/28052 |

OTHER PUBLICATIONS

Ki-Tae Park et al., "A World's First Product of Three-Dimensional Vertical NAND Flash Memory and Beyond", Non-Volatile Memory Technology Symposium, Oct. 2014, 1-5.

Hyung Jun Yang et al., "Programming Characteristics on Three-Dimensional NAND Flash Structure Using Edge Fringing Field Effect", Journal of Semiconductor Technology and Science, Oct. 2014, 537-542.

Wei Feng et al., "Study on cell shape in 3D NAND flash memory", Electron Devices and Solid-State Circuits , Jun. 2015, 387-390.

\* cited by examiner

THREE-DIMENSIONAL NON-VOLATILE MEMORY STRUCTURE AND MANUFACTURING METHOD THEREOF

CROSS-REFERENCE TO RELATED APPLICATION

This application claims the priority benefit of Taiwan application serial no. 106102237, filed on Jan. 20, 2017. The entirety of the above-mentioned patent application is hereby incorporated by reference herein and made a part of this specification.

BACKGROUND OF THE INVENTION

Field of the Invention

The invention relates to a memory structure and a manufacturing method thereof, and more particularly, to a three-dimensional non-volatile memory structure and a manufacturing method thereof.

Description of Related Art

Among current three-dimensional non-volatile memory structures, in the case of the 3D SONOS, due to the uneven crystal size of the channel layer, leakage current of the memory device is increased, and operation instability of the memory device is also increased, such that more power is consumed and the electrical performance of the memory device is poor as a result.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

The invention provides a three-dimensional non-volatile memory structure and a manufacturing method thereof that can achieve better electrical performance.

The invention provides a three-dimensional non-volatile memory structure including a substrate, a stacked structure, a charge storage pillar, a channel pillar, and a ferroelectric material pillar. The stacked structure is disposed on the substrate and includes a plurality of conductive layers and a plurality of first dielectric layers, and the conductive layers and the first dielectric layers are alternately stacked. The charge storage pillar is disposed in the stacked structure. The channel pillar is disposed inside the charge storage pillar. The ferroelectric material pillar is disposed inside the channel pillar.

According to an embodiment of the invention, in the three-dimensional non-volatile memory structure, the material of the conductive layer is, for instance, metal or doped polysilicon. The metal is, for instance, tungsten. The material of the first dielectric layer is, for instance, silicon oxide. The material of the channel pillar is, for instance, polysilicon.

According to an embodiment of the invention, in the three-dimensional non-volatile memory structure, the charge storage pillar includes a second dielectric layer, a third dielectric layer, and a charge trapping layer. The second dielectric layer is adjoined to the stacked structure. The third dielectric layer is adjoined to the channel pillar. The charge trapping layer is located between the second dielectric layer and the third dielectric layer.

According to an embodiment of the invention, in the three-dimensional non-volatile memory structure, the material of the second dielectric layer and the third dielectric layer is, for instance, silicon oxide. The material of the charge trapping layer is, for instance, silicone nitride.

According to an embodiment of the invention, in the three-dimensional non-volatile memory structure, the ferroelectric material pillar can have ferroelectric negative capacitance characteristics.

According to an embodiment of the invention, in the three-dimensional non-volatile memory structure, the material of the ferroelectric material pillar is, for instance, hafnium zirconium oxide (HfZrO), hafnium aluminum oxide (HfAlO), hafnium silicon oxide (HfSiO), hafnium yttrium oxide (HfYO), hafnium lanthanum oxide (HfLaO), hafnium gadolinium oxide (HfGdO), hafnium strontium oxide (HfSrO), hafnium samarium oxide (HfSmO), lead zirconate titanate (PZT), barium strontium titanate (BST), strontium bismuth tantalate (SBT), lead lanthanum zirconate titanate (PLZT), $LiNbO_3$, BaMgF, BaMnF, BaFeF, BaCoF, BaNiF, BaZnF, $SrAlF_5$, polyvinylidene difluoride (PVDF), PVDF-TrEE, or $La_{1-x}Sr_xMnO_3$.

According to an embodiment of the invention, in the three-dimensional non-volatile memory structure, the doping ratio of Zr of HfZrO can be 30% to 70%. The doping ratio of Al of HfAlO can be 2% to 12%. The doping ratio of Si of HfSiO can be 2% to 5%. The doping ratio of Y of HfYO can be 2% to 12%. The doping ratio of La of HfLaO can be 3% to 6%. The doping ratio of Gd of HfGdO can be 2% to 6%. The doping ratio of Sr of HfSrO can be 2% to 6%. The doping ratio of Sm of HfSmO can be 2% to 6%.

According to an embodiment of the invention, in the three-dimensional non-volatile memory structure, a conductive pillar is further included. The conductive pillar is disposed inside the ferroelectric material pillar.

According to an embodiment of the invention, in the three-dimensional non-volatile memory structure, the material of the conductive pillar is, for instance, a metal compound.

According to an embodiment of the invention, in the three-dimensional non-volatile memory structure, the metal compound is, for instance, metal nitride or metal carbide.

According to an embodiment of the invention, in the three-dimensional non-volatile memory structure, the metal compound is, for instance, titanium nitride (TiN), tantalum nitride (TaN), tantalum carbon nitride (TaCN), tungsten nitride (WN), titanium tungsten nitride (TiWN), titanium carbide (TiC), titanium aluminum carbide (TiAlC), tantalum carbide (TaC), tantalum aluminum carbide (TaAlC), or niobium aluminum carbide (NbAlC).

The invention provides a manufacturing method of a three-dimensional non-volatile memory structure including the following steps. A stacked structure is formed on a substrate, wherein the stacked structure includes a plurality of conductive layers and a plurality of first dielectric layers, and the conductive layers and the first dielectric layers are alternately stacked. A charge storage pillar is formed in the stacked structure. A channel pillar is formed inside the charge storage pillar. A ferroelectric material pillar is formed inside the channel pillar.

According to an embodiment of the invention, in the manufacturing method of the three-dimensional non-volatile memory structure, the charge storage pillar includes a second dielectric layer, a third dielectric layer, and a charge trapping layer. The second dielectric layer is adjoined to the stacked structure. The third dielectric layer is adjoined to the channel pillar. The charge trapping layer is located between the second dielectric layer and the third dielectric layer.

According to an embodiment of the invention, in the manufacturing method of the three-dimensional non-volatile memory structure, the ferroelectric material pillar can have ferroelectric negative capacitance characteristics.

According to an embodiment of the invention, in the manufacturing method of the three-dimensional non-volatile memory structure, the material of the ferroelectric material pillar is, for instance, hafnium zirconium oxide (HfZrO), hafnium aluminum oxide (HfAlO), hafnium silicon oxide (HfSiO), hafnium yttrium oxide (HfYO), hafnium lanthanum oxide (HfLaO), hafnium gadolinium oxide (HfGdO), hafnium strontium oxide (HfSrO), hafnium samarium oxide (HfSmO), lead zirconate titanate (PZT), barium strontium titanate (BST), strontium bismuth tantalate (SBT), lead lanthanum zirconate titanate (PLZT), $LiNbO_3$, $BaMgF$, $BaMnF$, $BaFeF$, $BaCoF$, $BaNiF$, $BaZnF$, $SrAlF_5$, polyvinylidene difluoride (PVDF), PVDF-TrEE, or $La_{1-x}Sr_xMnO_3$.

According to an embodiment of the invention, in the manufacturing method of the three-dimensional non-volatile memory structure, the doping ratio of Zr of HfZrO can be 30% to 70%. The doping ratio of Al of HfAlO can be 2% to 12%. The doping ratio of Si of HfSiO can be 2% to 5%. The doping ratio of Y of HfYO can be 2% to 12%. The doping ratio of La of HfLaO can be 3% to 6%. The doping ratio of Gd of HfOdO can be 2% to 6%. The doping ratio of Sr of HfSrO can be 2% to 6%. The doping ratio of Sm of HfSmO can be 2% to 6%.

According to an embodiment of the invention, in the manufacturing method of the three-dimensional non-volatile memory structure, a conductive pillar is further formed inside the ferroelectric material pillar.

According to an embodiment of the invention, in the manufacturing method of the three-dimensional non-volatile memory structure, the material of the conductive pillar is, for instance, a metal compound.

According to an embodiment of the invention, in the manufacturing method of the three-dimensional non-volatile memory structure, the metal compound is, for instance, metal nitride or metal carbide.

According to an embodiment of the invention, in the manufacturing method of the three-dimensional non-volatile memory structure, the metal compound is, for instance, titanium nitride (TiN), tantalum nitride (TaN), tantalum carbon nitride (TaCN), tungsten nitride (WN), titanium tungsten nitride (TiWN), titanium carbide (TiC), titanium aluminum carbide (TiAlC), tantalum carbide (TaC), tantalum aluminum carbide (TaAlC), or niobium aluminum carbide (NbAlC).

Based on the above, in the three-dimensional non-volatile memory structure and the manufacturing method thereof provided by the invention, since the ferroelectric material pillar is disposed inside the channel pillar, leakage current can be effectively reduced, operating voltage of the memory can be reduced, operating speed can be increased, and instability of threshold voltage drift can be improved. As a result, the three-dimensional non-volatile memory structure can have better electrical performance.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Embodiments of the present invention may comprise any one or more of the novel features described herein, including in the Detailed Description, and/or shown in the drawings.

As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 1A:
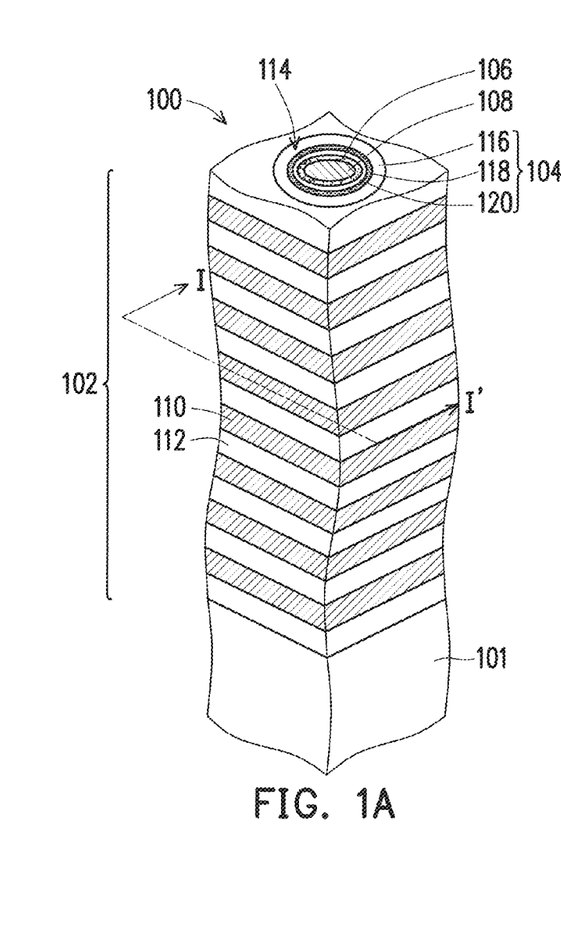
FIG. 1A is a three-dimensional schematic diagram of a three-dimensional non-volatile memory structure of an embodiment of the invention.
Figure 1B:
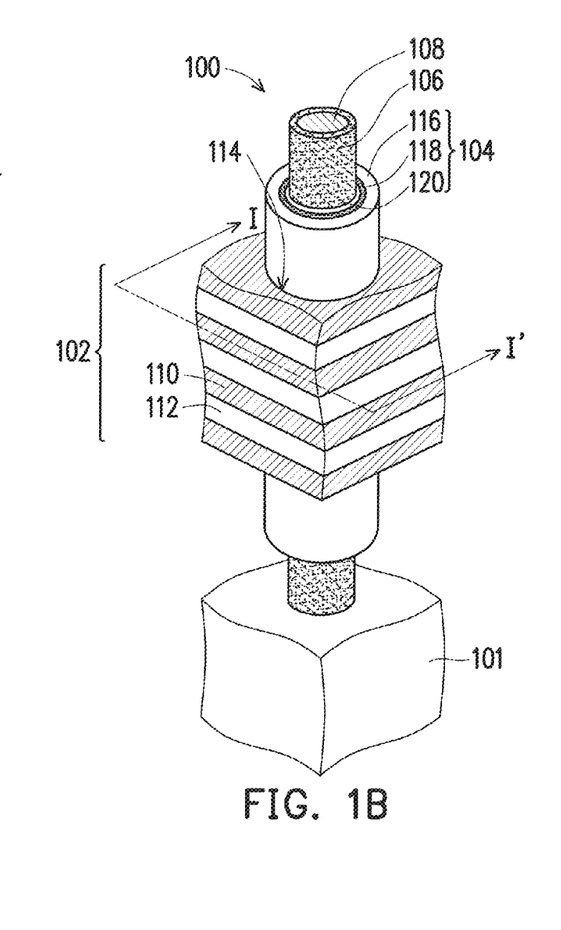
FIG. 1B is a partial three-dimensional schematic diagram of FIG. 1A.
Figure 1C:
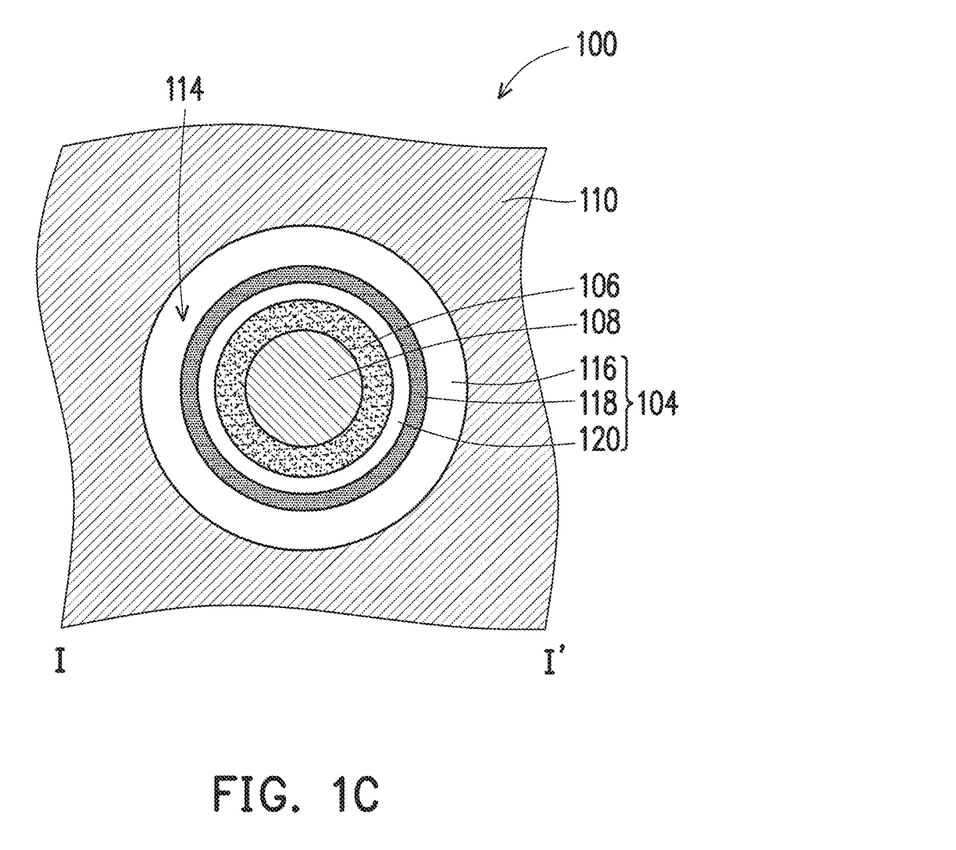
FIG. 1C is a cross-section along section line I-I' in FIG. 1A.

FIG. 1A is a three-dimensional schematic diagram of a three-dimensional non-volatile memory structure of an embodiment of the invention. FIG. 1B is a partial three-dimensional schematic diagram of FIG. 1A describing the relative locations of the components. FIG. 1C is a cross-section along section line I-I' in FIG. 1A.

Referring to all of FIG. 1A to FIG. 1C, a three-dimensional non-volatile memory structure 100 includes a substrate 101, a stacked structure 102, a charge storage pillar 104, a channel pillar 106, and a ferroelectric material pillar 108. In the present embodiment, the three-dimensional non-volatile memory structure 100 is exemplified by a three-dimensional NAND flash memory, but the invention is not limited thereto. The substrate 101 is, for instance, a semiconductor substrate such as a silicon substrate.

The stacked structure 102 is disposed on the substrate 101 and includes a plurality of conductive layers 110 and a plurality of dielectric layers 112 that are alternately stacked. The stacked structure 102 has an opening 114, and the opening 114 can expose the substrate 101. The conductive layer 110 can be used as a control gate, and the material thereof is, for instance, metal or doped polysilicon, wherein the metal is, for instance, tungsten. The dielectric layer 112 can be used as a blocking layer, and the material thereof is, for instance, silicon oxide.

The charge storage pillar 104 is disposed in the stacked structure 102, such as disposed in the opening 114 of the stacked structure 102. The charge storage pillar 104 includes a dielectric layer 116, a dielectric layer 120, and a charge trapping layer 118. In particular, the dielectric layer 116 is adjoined to the stacked structure 102 and can be used as a blocking layer, and the material thereof is, for instance, silicon oxide. The dielectric layer 120 is adjoined to the channel pillar 106, the dielectric layer 120 can be used as a tunneling dielectric layer, and the material thereof is, for instance, silicon oxide. The charge trapping layer 118 is located between the dielectric layer 116 and the dielectric layer 120, and the material of the charge trapping layer 118 is, for instance, silicon nitride.

The channel pillar 106 is disposed inside the charge storage pillar 104 and adjoined to the dielectric layer 120, the material of the channel pillar 106 is, for instance, polysilicon. The channel pillar 106 can be used as the vertical channel of the three-dimensional non-volatile memory structure 100.

The ferroelectric material pillar 108 is disposed inside the channel pillar 106 and adjoined to the channel pillar 106. Since the ferroelectric material can restrict the crystal size in the material of the channel pillar 106, leakage current can be effectively reduced. Moreover, since the ferroelectric material has a high dielectric constant (high k value), electric field distribution can be changed, and as a result, the operating voltage of the memory can be reduced and the operating speed can be increased, and instability of threshold voltage drift can be improved. Accordingly, the three-dimensional non-volatile memory structure 100 can have better electrical performance.

The ferroelectric material pillar 108 can have ferroelectric negative capacitance characteristics, and in addition to further reducing the operating voltage and power consumption caused by switching and increasing conduction current and reducing subthreshold swing of the memory device, the Off-state leakage current ($I_{off}$) of the memory device can be further reduced.

The material of the ferroelectric material pillar 108 is, for instance, hafnium zirconium oxide (HfZrO), hafnium aluminum oxide (HfAlO), hafnium silicon oxide (HfSiO), hafnium yttrium oxide (HfYO), hafnium lanthanum oxide (HfLaO), hafnium gadolinium oxide (HfGdO), hafnium strontium oxide (HfSrO), hafnium samarium oxide (HfSmO), lead zirconate titanate (PZT), barium strontium titanate (BST), strontium bismuth tantalate (SBT), lead lanthanum zirconate titanate (PLZT), $LiNbO_3$, BaMgF, BaMnF, BaFeF, BaCoF, BaNiF, BaZnF, $SrAlF_5$, polyvinylidene difluoride (PVDF), PVDF-trifluoroethylene (PVDF-TrEE), or $La_{1-x}Sr_xMnO_3$. The forming method of the ferroelectric material pillar 108 is, for instance, a chemical vapor deposition method or a physical vapor deposition method.

If the ferroelectric material pillar 108 is a ferroelectric material for which hafnium oxide is the base material, a doping process can be performed using a dopant such as Zr, Al, Si, Y, La, Gd, Sr, or Sm. For instance, the doping ratio of Zr of HfZrO can be 30% to 70%. The doping ratio of Al of HfAlO can be 2% to 12%. The doping ratio of Si of HfSiO can be 2% to 5%. The doping ratio of Y of HfYO can be 2% to 12%. The doping ratio of La of HfLaO can be 3% to 6%. The doping ratio of Gd of HfGdO can be 2% to 6%. The doping ratio of Sr of HfSrO can be 2% to 6%. The doping ratio of Sm of HfSmO can be 2% to 6%.

Moreover, the three-dimensional non-volatile memory structure 100 can further include a doped region (not shown) located in the substrate 101 and a wire (not shown) located above the channel pillar 106 respectively used as the source line and the bit line.

It can be known from the above embodiments that, since the ferroelectric material pillar 108 is disposed inside the channel pillar 106, leakage current can be effectively reduced, the operating voltage of the memory can be reduced and the operating speed can be increased, and instability of threshold voltage drift can be improved. As a result, the three-dimensional non-volatile memory structure 100 can have better electrical performance.

Figure 2A:
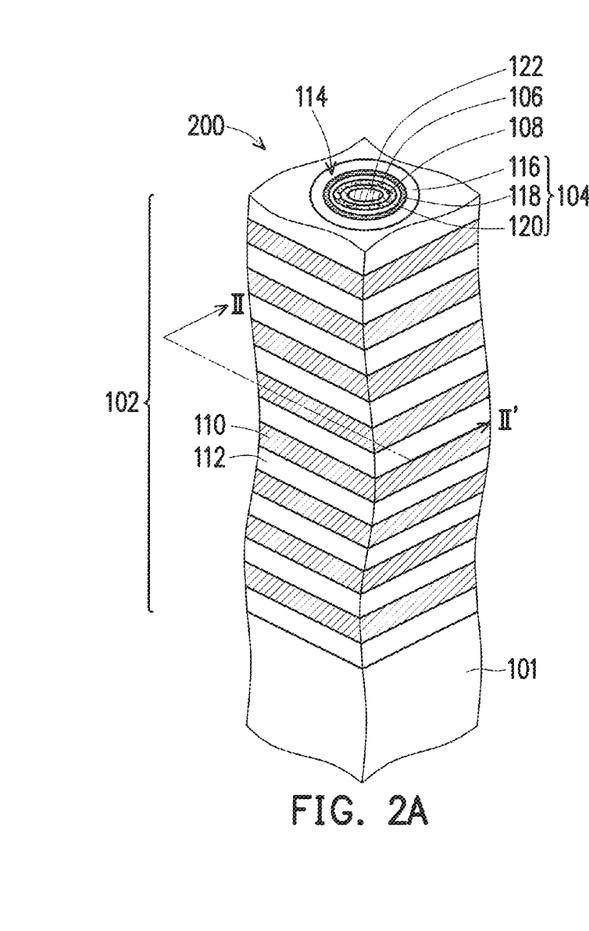
FIG. 2A is a three-dimensional schematic diagram of a three-dimensional non-volatile memory structure of an embodiment of the invention.
Figure 2B:
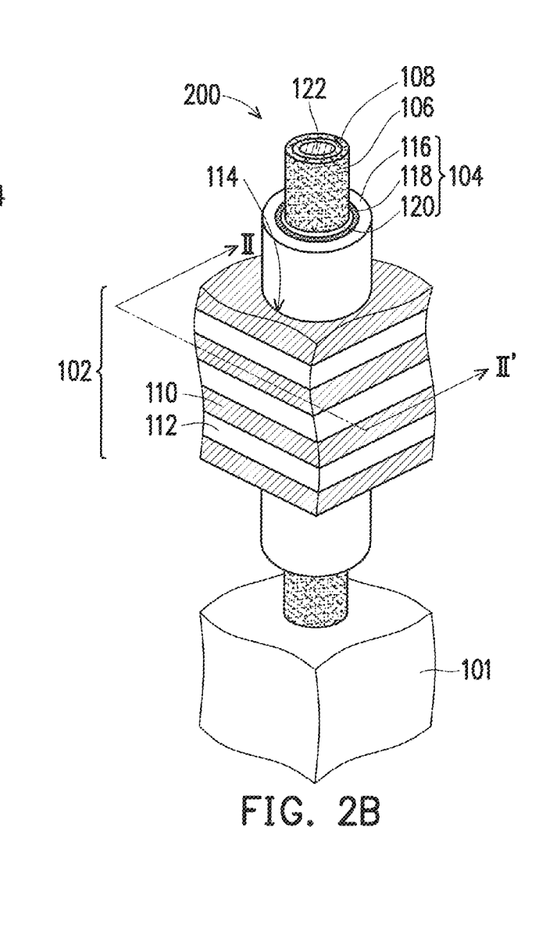
FIG. 2B is a partial three-dimensional schematic diagram of FIG. 2A.
Figure 2C:
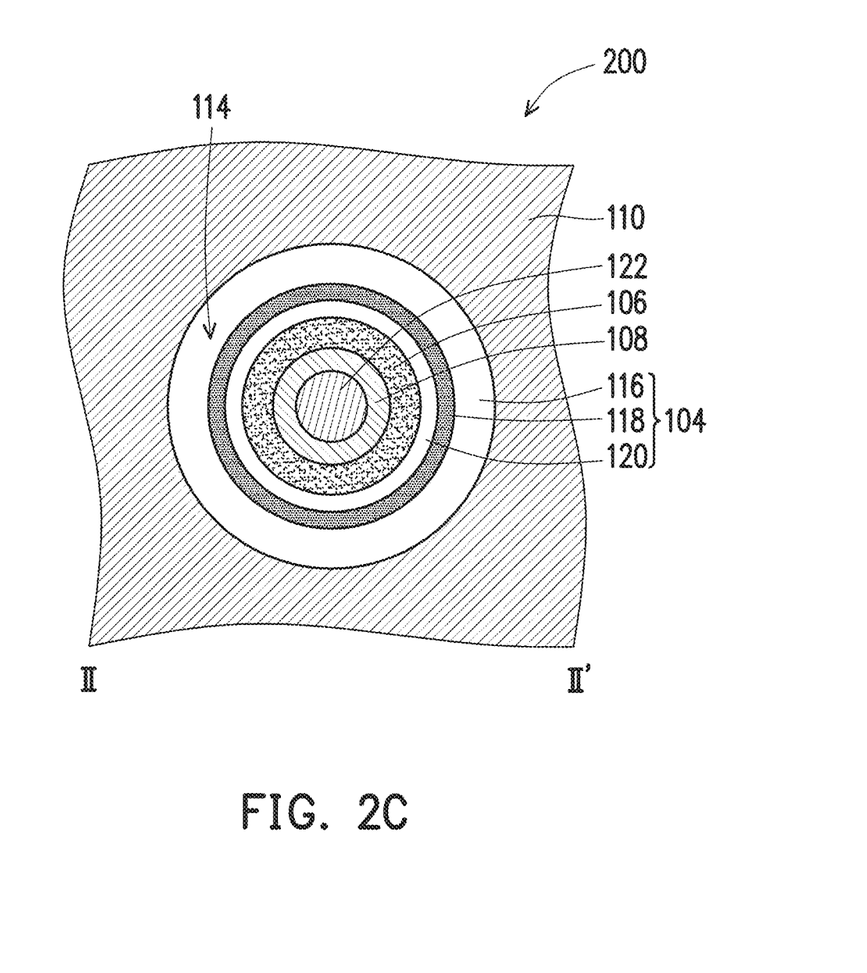
FIG. 2C is a cross-section along section line II-II' in FIG. 2A.

FIG. 2A is a three-dimensional schematic diagram of a three-dimensional non-volatile memory structure of an embodiment of the invention. FIG. 2B is a partial three-dimensional schematic diagram of FIG. 2A describing the relative locations of the components. FIG. 2B is a cross-section along section line II-II' in FIG. 2A.

Referring to all of FIG. 1A to FIG. 1C and FIG. 2A to FIG. 2C, the differences between a three-dimensional non-volatile memory structure 200 and the three-dimensional non-volatile memory structure 100 are: the three-dimensional non-volatile memory structure 200 further includes a conductive pillar 122, and the conductive pillar 122 is disposed inside the ferroelectric material pillar 108 and can be a single-layer structure or a multi-layer structure, and the material thereof is, for instance, a material that can provide greater stress, such as a metal compound. The metal compound is, for instance, metal nitride or metal carbide such as titanium nitride (TiN), tantalum nitride (TaN), tantalum carbon nitride (TaCN), tungsten nitride (WN), titanium tungsten nitride (TiWN), titanium carbide (TiC), titanium aluminum carbide (TiAlC), tantalum carbide (TaC), tantalum aluminum carbide (TaAlC), or niobium aluminum carbide (NbAlC). The forming method of the conductive pillar 122 is, for instance, a chemical vapor deposition method or a physical vapor deposition method. Moreover, other similar members in the three-dimensional non-volatile memory structure 200 and the three-dimensional non-volatile memory structure 100 are represented by the same reference numerals and descriptions thereof are omitted.

It can be known from the above embodiments that, in the three-dimensional non-volatile memory structure 200, since the conductive pillar 122 can be used as an inner gate, the control capability for the memory device can be effectively increased. Moreover, when the ferroelectric material pillar 108 is subjected to the strain effect caused by the conductive pillar 122, the material of the ferroelectric material pillar 108 is more readily phase-transformed from metastable state monoclinic phase to orthorhombic phase to improve ferroelectric characteristics and ferroelectric negative capacitance characteristics. As a result, the operating speed and endurance of the memory device can be further increased.

Figure 3:
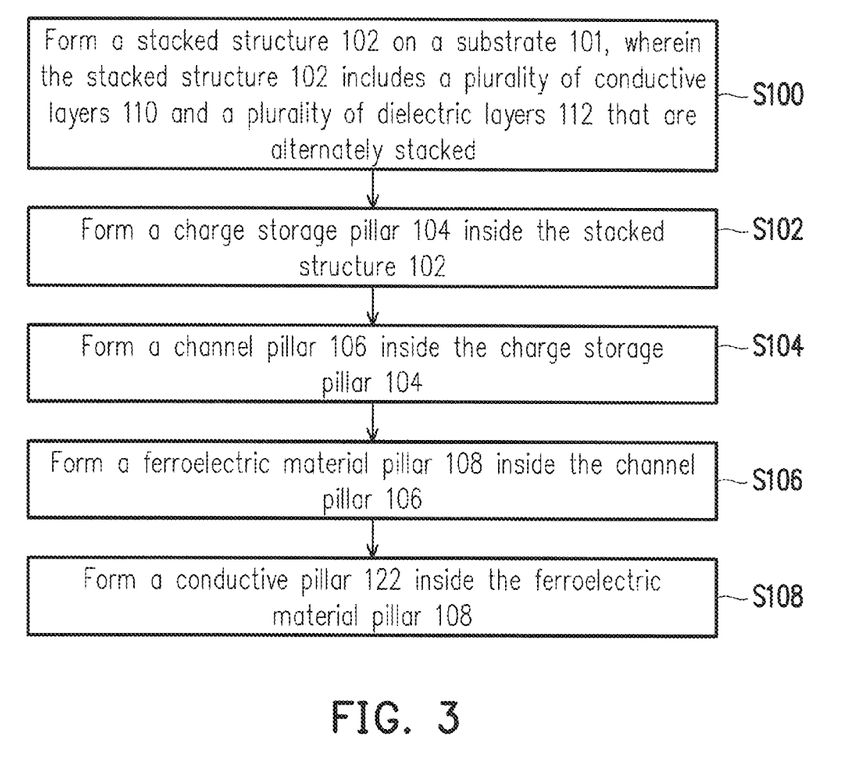
FIG. 3 is a flow chart of manufacturing a three-dimensional non-volatile memory structure of an embodiment of the invention.

FIG. 3 is a flow chart of manufacturing a three-dimensional non-volatile memory structure of an embodiment of the invention.

Hereinafter, the manufacturing methods of the three-dimensional non-volatile memory structure 100 and the three-dimensional non-volatile memory structure 200 of the above embodiments are described via FIG. 3, but the invention is not limited thereto.

Referring to FIGS. 1A-IC and FIG. 3, the manufacturing method of the three-dimensional non-volatile memory structure 100 can include step S100 to step S106. Step S100 is performed to form a stacked structure 102 on a substrate 101, wherein the stacked structure 102 includes a plurality of conductive layers 110 and a plurality of dielectric layers 112 that are alternately stacked. Step S102 is performed to form a charge storage pillar 104 in the stacked structure 102. The charge storage pillar 104 includes a dielectric layer 116, a dielectric layer 120, and a charge trapping layer 118, wherein the dielectric layer 116 is adjoined to the stacked structure 102, the dielectric layer 120 is adjoined to a channel pillar 106, and the charge trapping layer 118 is located between the dielectric layer 116 and the dielectric layer 120. Step S104 is performed to form the channel pillar 106 inside the charge storage pillar 104. Step S106 is performed to form a ferroelectric material pillar 108 inside the channel pillar 106.

Referring to FIGS. 2A-2B and FIG. 3, the manufacturing method of the three-dimensional non-volatile memory structure 200 not only includes step S100 to step S106, but also includes step S108 to form a conductive pillar 122 inside the ferroelectric material pillar 108.

Hereinafter, the electrical performance of the three-dimensional non-volatile memory structures of the above embodiments is described via an experimental example, but the following experimental example is only exemplary, and the invention is not limited thereto.

Figure 4:
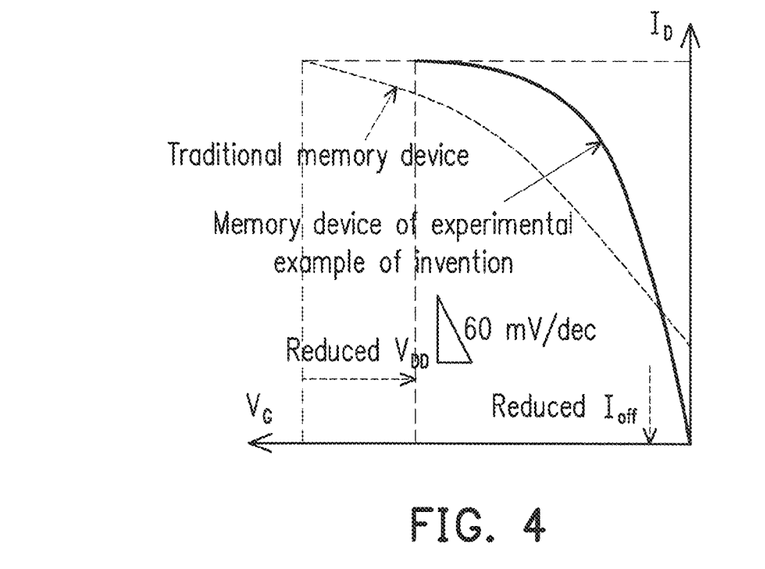
FIG. 4 is an $I_D$ (drain current)-$V_G$ (gate voltage) curve of the hafnium zirconium oxide memory device of the experimental example of the invention and a known memory device.

FIG. 4 is an $I_D$-$V_G$ curve of the hafnium zirconium oxide memory device of the experimental example of the invention and a known memory device.

Referring to FIG. 4, in comparison to the subthreshold swing (SS) curve of a traditional memory device limited to an SS of 60 mV/dec, since the memory device of the experimental example of the invention adopts a ferroelectric material having ferroelectric negative capacitance characteristics, the memory device of the experimental example of the invention can generate a steeper SS curve via a ferroelectric negative-capacitance effect, such that not only can reduce the operating voltage ($V_{DO}$) and the power consumption caused by switching of the memory device, the Off-state leakage current ($I_{off}$) of the memory device can also be lowered.

Figure 5:
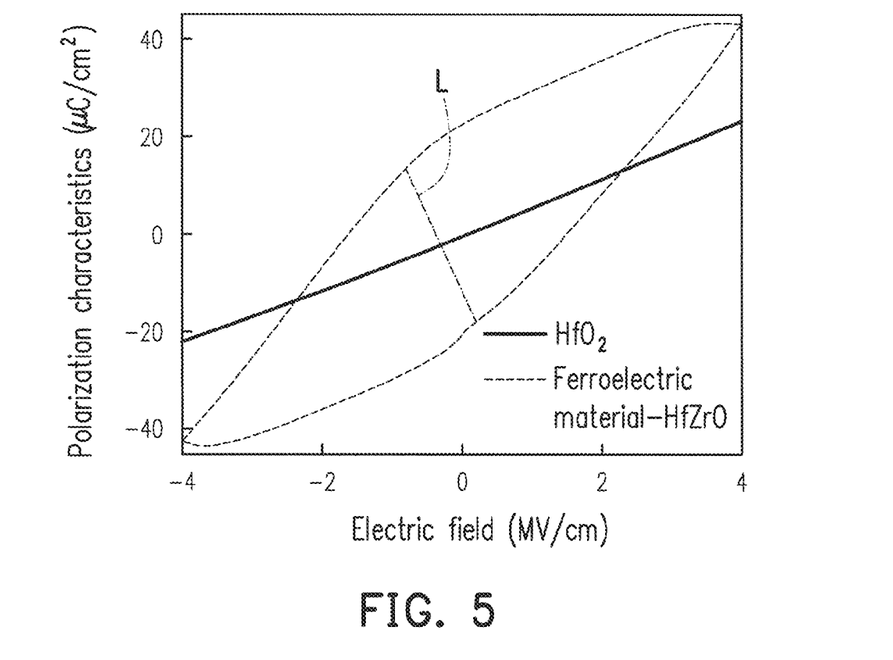
FIG. 5 shows the relationship of polarization characteristics and electric field of hafnium oxide ($HfO_2$) and hafnium zirconium oxide (HfZrO).

FIG. 5 shows the relationship of polarization characteristics and electric field of hafnium oxide ($HfO_2$) and hafnium zirconium oxide (HfZrO).

Referring to FIG. 5, the dotted line is the hysteresis curve of ferroelectric material-hafnium zirconium oxide (HfZrO), the solid line is the hysteresis curve of hafnium oxide ($HfO_2$), and the auxiliary line L is a virtual and unstable hysteresis curve simulated according to a Landau model. Since dP/dE of the auxiliary line L is less than 0, the ferroelectric material-hafnium zirconium oxide is proven to have ferroelectric negative capacitance characteristics.

Figure 6:
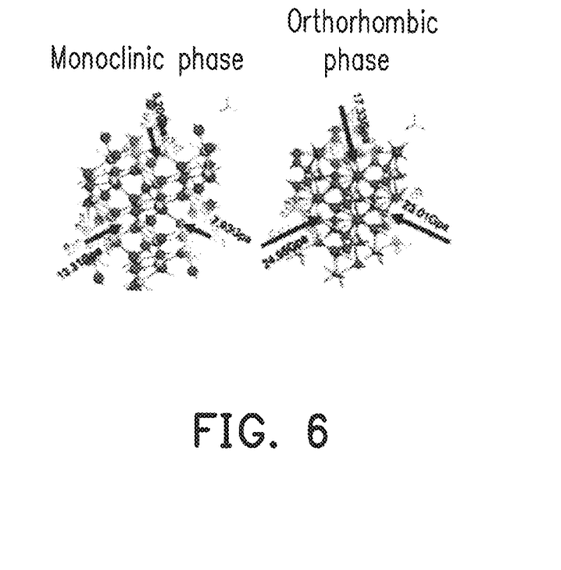
FIG. 6 shows atomic structures of monoclinic phase and orthorhombic phase hafnium oxide.

FIG. 6 shows atomic structures of monoclinic phase and orthorhombic phase hafnium oxide.

Referring to FIG. 6, the crystal phase of hafnium oxide can be transformed from metastable monoclinic phase to the more stable orthorhombic phase only when hafnium oxide ($HfO_2$) is subjected to a greater strain so as to achieve ferroelectric negative capacitance characteristics.

Figure 7:
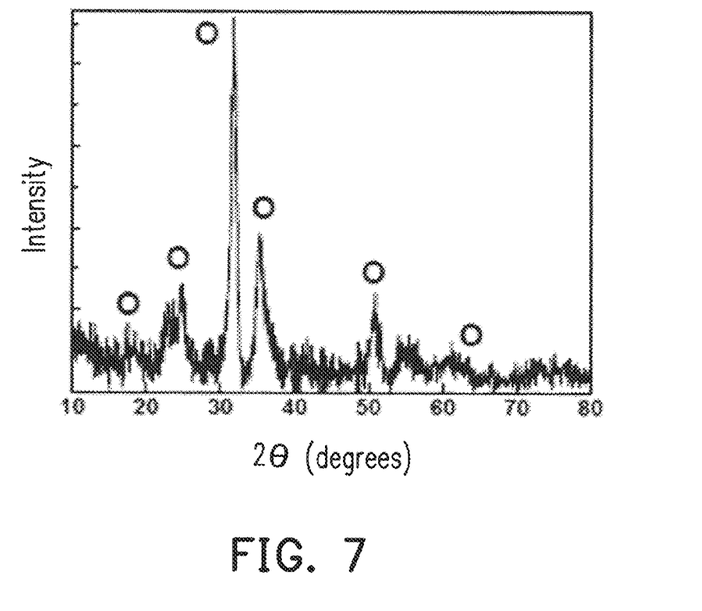
FIG. 7 is a grazing incident X-ray diffraction (GI-XRD) diagram of a ferroelectric material-hafnium zirconium oxide film.

FIG. 7 is a grazing incident X-ray diffraction (GI-XRD) diagram of a ferroelectric material-hafnium zirconium oxide film.

Referring to FIG. 7, by measuring the ferroelectric material-hafnium zirconium oxide (HfZrO) film via a grazing incident X-ray diffraction (GI-XRD) method, it can be known that the crystal phase of the ferroelectric material-hafnium zirconium oxide (HfZrO) film is orthorhombic phase.

Figure 8:
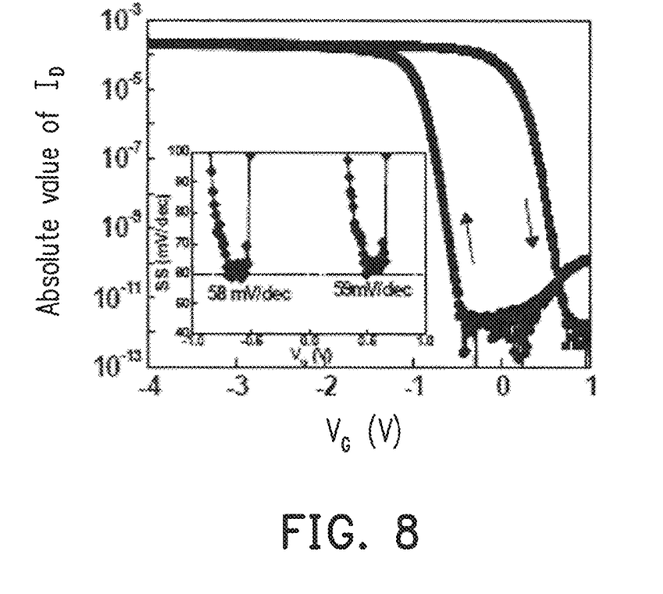
FIG. 8 is an $I_D$-$V_G$ curve of the hafnium zirconium oxide memory device of the experimental example of the invention.

FIG. 8 is an $I_D$-$V_G$ curve of the hafnium zirconium oxide memory device of the experimental example of the invention.

Referring to FIG. 8, a sweep is performed on the hafnium zirconium oxide memory device of the experimental example of the invention at biases of +6V and −6V, and the drain voltage ($V_D$) is −0.2 V. It can be known from the $I_D$-$V_G$ curve of FIG. 8 that, the ferroelectric material can reduce the subthreshold swing (SS) and have ferroelectric negative capacitance characteristics. In comparison to the SS curve of a traditional memory device limited to an SS of 60 mV/dec, since the memory device of the experimental example of the invention adopts a ferroelectric material having ferroelectric negative capacitance characteristics, the SS can be less than 60 mV/dec, for example, as low as 58 mV/dec and 59 mV/dec.

Figure 9:
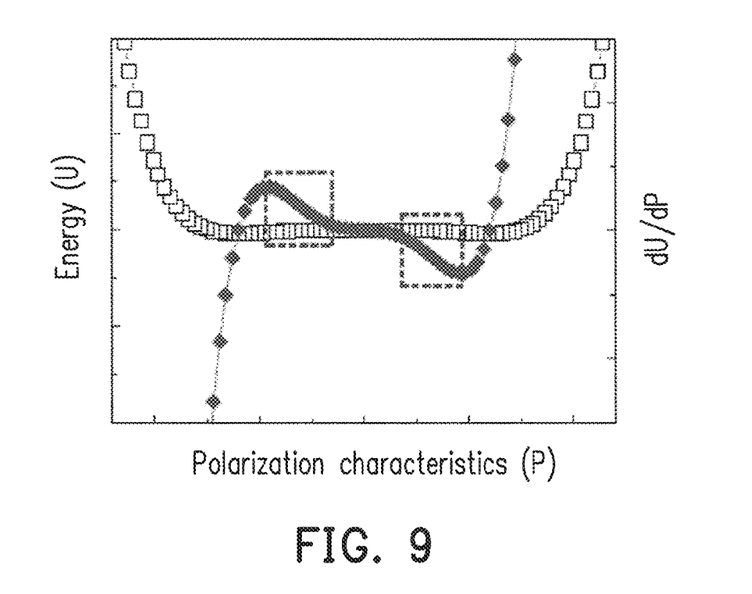
FIG. 9 is a diagram of the relationship of polarization characteristics versus energy and dU/dP of the hafnium zirconium oxide memory device of the experimental example of the invention.

FIG. 9 is a diagram of the relationship of polarization characteristics versus energy and dU/dP of the hafnium zirconium oxide memory device of the experimental example of the invention.

Referring to FIG. 9, the curve formed by the white squares shows the relationship of polarization characteristics and energy, and the curve formed by the black rhombi is the dU/dP curve obtained after differentiation. It is clear from FIG. 9 that, the dU/dP curve has two regions of local negative slope (dotted boxes in FIG. 9). In a negative capacitance model, this indicates that a ferroelectric negative capacitance effect is present in a bi-stable potential well in the memory device of the experimental example of the invention.

Figure 10:
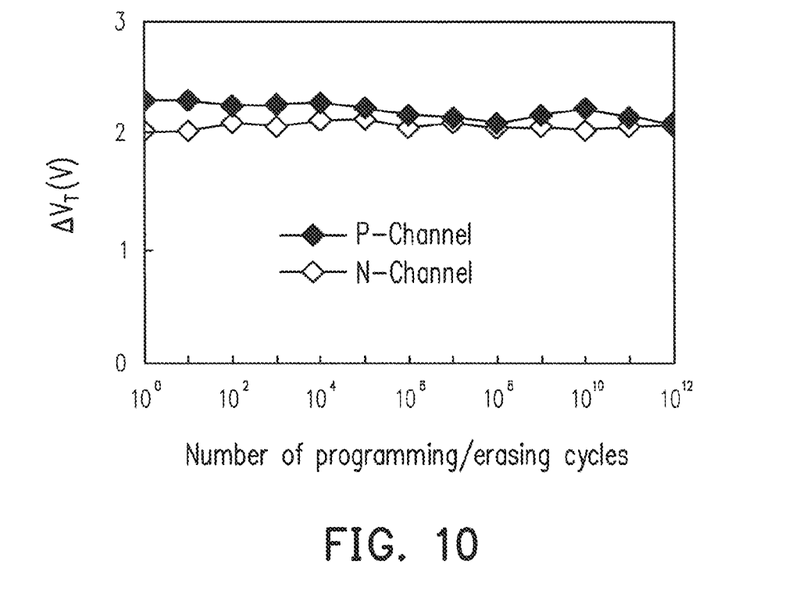
FIG. 10 is a curve diagram showing a result of an endurance test of the hafnium zirconium oxide memory device of the experimental example of the invention.

FIG. 10 is a curve diagram showing a result of an endurance test of the hafnium zirconium oxide memory device of the experimental example of the invention.

Referring to FIG. 10, during the programming and erase operations under the operating conditions of voltages of +5 V and −5 V and a pulse of 20 ns, the memory device of the experimental example of the invention can still be measured to have stable $\Delta V_T$ (threshold voltage difference) even after $10^{12}$ programming/erasing (P/E) cycles at 25° C. Therefore, the memory device of the experimental example of the invention has better endurance and memory characteristics.

Figure 11:
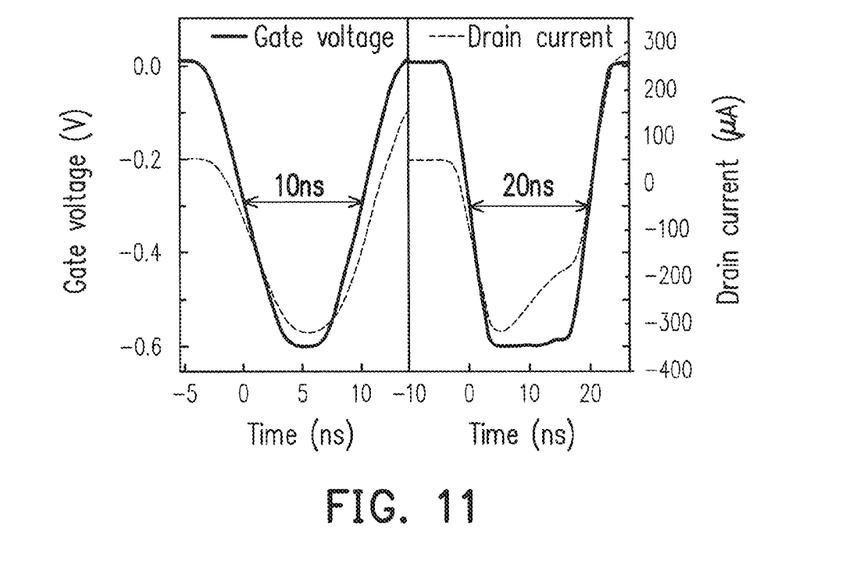
FIG. 11 is a curve diagram showing the ferroelectric-antiferroelectric phase conversion speed of the hafnium zirconium oxide memory device of the experimental example of the invention.

FIG. 11 is a curve diagram showing the ferroelectric-antiferroelectric phase conversion speed of the hafnium zirconium oxide memory device of the experimental example of the invention.

Referring to FIG. 11, a rapid current response discloses the ferroelectric-antiferroelectric (FE-AFE) phase transition time in a programming state is only 10 ns. Therefore, the operating speed of the memory device of the experimental example of the invention is fast.

Figure 12:
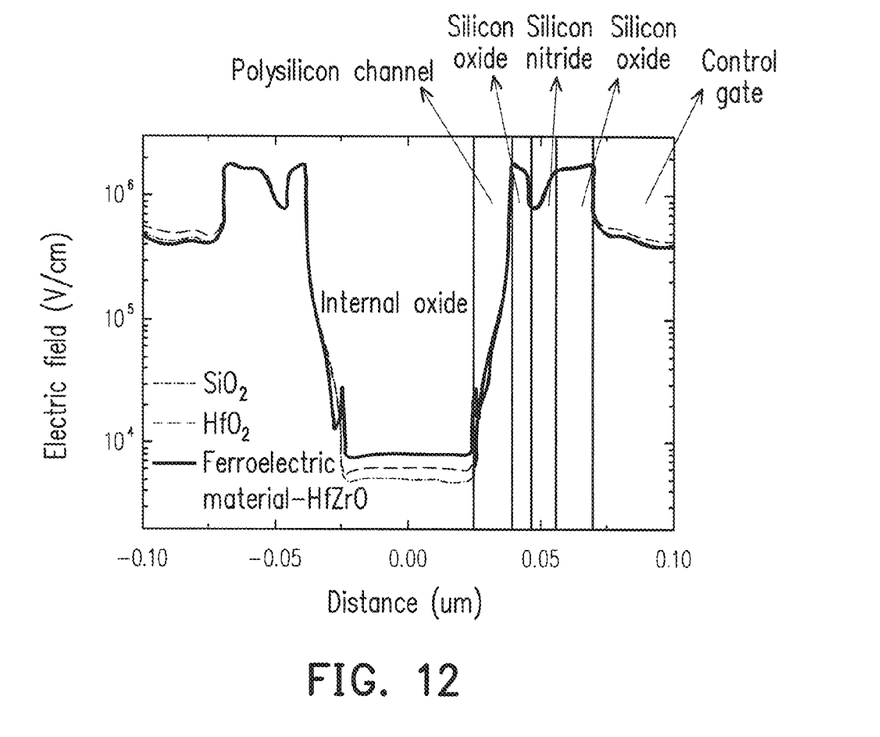
FIG. 12 is an electric field distribution of a memory device adopting different internal oxides.

FIG. 12 is an electric field distribution of a memory device adopting different internal oxides.

Referring to FIG. 12, in comparison to a memory device adopting silicon dioxide ($SiO_2$) and hafnium oxide ($HfO_2$) as the internal oxides, since the memory device of the experimental example of the invention adopts ferroelectric material-hafnium zirconium oxide as the internal oxide, it can be observed that the electric field is higher at the location of the internal oxide, and therefore better electric field control capability is achieved.

Figure 13:
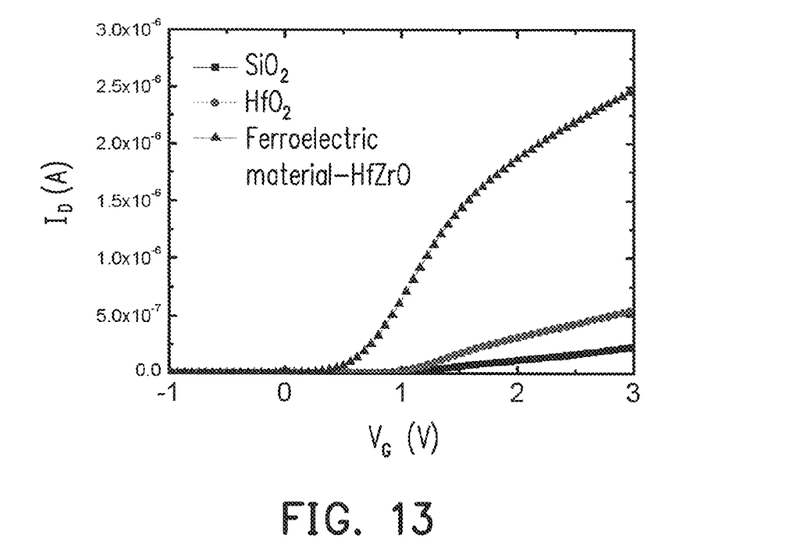
FIG. 13 is an $I_D$-$V_G$ curve of a memory device adopting different internal oxides during a programming operation.
Figure 14:
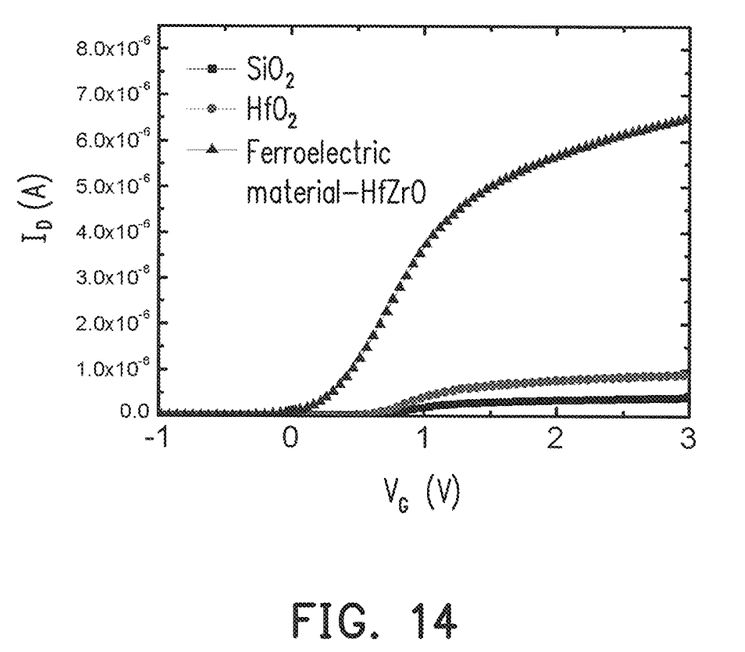
FIG. 14 is an $I_D$-$V_G$ curve of a memory device adopting different internal oxides during an erase operation.

FIG. 13 is an $I_D$-$V_G$ curve of a memory device adopting different internal oxides during a programming operation. FIG. 14 is an $I_D$-$V_G$ curve of a memory device adopting different internal oxides during an erase operation.

Referring to FIG. 13 and FIG. 14, when programming operation and erase operation are performed at a drain voltage ($V_D$) of 0.1 V, in comparison to a memory device adopting silicon dioxide ($SiO_2$) and hafnium oxide ($HfO_2$) as the internal oxides, since the memory device of the experimental example of the invention adopts ferroelectric material-hafnium zirconium oxide as the internal oxide, a greater ON-state current is achieved. Moreover, since the memory device of the experimental example of the invention adopts ferroelectric material-hafnium zirconium oxide as the internal oxide, a smaller threshold voltage ($V_T$) is achieved. It can therefore be proven that, the memory device of the experimental example of the invention can have lower operating voltage, and therefore operating speed can be increased.

Based on the above, in the three-dimensional non-volatile memory structure and the manufacturing method thereof of the above embodiments, since the ferroelectric material pillar is disposed inside the channel pillar, leakage current can be effectively reduced, the operating voltage of the memory can be reduced and the operating speed can be increased, and instability of threshold voltage drift can be improved. As a result, the three-dimensional non-volatile memory structure can have better electrical performance.

The previously described exemplary embodiments of the present invention have many advantages, including effectively reducing leakage current, reducing the operating voltage of the memory, increasing the operating speed, improving instability of threshold voltage drift and having better electrical performance, wherein the advantages aforementioned not required in all versions of the invention.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A three-dimensional non-volatile memory structure, comprising:
   a substrate;
   a stacked structure disposed on the substrate and comprising a plurality of conductive layers and a plurality of first dielectric layers, wherein the conductive layers and the first dielectric layers are alternately stacked;
   a charge storage pillar disposed in the stacked structure;
   a channel pillar disposed inside the charge storage pillar; and
   a ferroelectric material pillar disposed inside the channel pillar.

2. The three-dimensional non-volatile memory structure of claim 1, wherein a material of the conductive layers comprises a metal or a doped polysilicon, the metal comprises tungsten, a material of the first dielectric layers comprises silicon oxide, and a material of the channel pillar comprises polysilicon.

3. The three-dimensional non-volatile memory structure of claim 1, wherein the charge storage pillar comprises:
   a second dielectric layer adjoined to the stacked structure;
   a third dielectric layer adjoined to the channel pillar; and
   a charge trapping layer located between the second dielectric layer and the third dielectric layer.

4. The three-dimensional non-volatile memory structure of claim 3, wherein a material of the second dielectric layer and the third dielectric layer comprises silicon oxide, and a material of the charge trapping layer comprises silicon nitride.

5. The three-dimensional non-volatile memory structure of claim 1, wherein the ferroelectric material pillar has ferroelectric negative capacitance characteristics.

6. The three-dimensional non-volatile memory structure of claim 1, wherein a material of the ferroelectric material pillar comprises HfZrO, HfAlO, HfSiO, HfYO, HfLaO, HfGdO, HfSrO, HfSmO, PZT, BST, SBT, PLZT, $LiNbO_3$, BaMgF, BaMnF, BaFeF, BaCoF, BaNiF, BaZnF, $SrAlF_5$, PVDF, PVDF-TrEE, or $La_{1-x}Sr_xMnO_3$.

7. The three-dimensional non-volatile memory structure of claim 6, wherein a doping ratio of Zr of HfZrO is 30% to 70%,
   a doping ratio of Al of HfAlO is 2% to 12%,
   a doping ratio of Si of HfSiO is 2% to 5%,
   a doping ratio of Y of HfYO is 2% to 12%,
   a doping ratio of La of HfLaO is 3% to 6%,
   a doping ratio of Gd of HfGdO is 2% to 6%,
   a doping ratio of Sr of HfSrO is 2% to 6%,
   a doping ratio of Sm of HfSmO is 2% to 6%.

8. The three-dimensional non-volatile memory structure of claim 1, further comprising a conductive pillar disposed inside the ferroelectric material pillar.

9. The three-dimensional non-volatile memory structure of claim 8, wherein a material of the conductive pillar comprises a metal compound.

10. The three-dimensional non-volatile memory structure of claim 9, wherein the metal compound comprises metal nitride or metal carbide.

11. The three-dimensional non-volatile memory structure of claim 10, wherein the metal compound comprises titanium nitride, tantalum nitride, tantalum carbon nitride, tungsten nitride, titanium tungsten nitride, titanium carbide, titanium aluminum carbide, tantalum carbide, tantalum aluminum carbide, or niobium aluminum carbide.

12. A manufacturing method of a three-dimensional non-volatile memory structure, comprising:
   forming a stacked structure on a substrate, wherein the stacked structure comprises a plurality of conductive layers and a plurality of first dielectric layers, and the conductive layers and the first dielectric layers are alternately stacked;
   forming a charge storage pillar in the stacked structure;
   forming a channel pillar inside the charge storage pillar; and
   forming a ferroelectric material pillar inside the channel pillar.

13. The manufacturing method of the three-dimensional non-volatile memory structure of claim 12, wherein the charge storage pillar comprises:
   a second dielectric layer adjoined to the stacked structure;
   a third dielectric layer adjoined to the channel pillar, and
   a charge trapping layer located between the second dielectric layer and the third dielectric layer.

14. The manufacturing method of the three-dimensional non-volatile memory structure of claim 12, wherein the ferroelectric material pillar has ferroelectric negative capacitance characteristics.

15. The manufacturing method of the three-dimensional non-volatile memory structure of claim 12, wherein a material of the ferroelectric material pillar comprises HtZrO, HfAlO, HfSiO, HfYO, HfLaO, HfGdO, HfSrO, HfSmO, PZT, BST, SBT, PLZT, LiNbO$_3$, BaMgF, BaMnF, BaFeF, BaCoF, BaNiF, BaZnF, SrAlF$_5$, PVDF, PVDF-TrEE, or La$_{1-x}$Sr$_x$MnO$_3$.

16. The manufacturing method of the three-dimensional non-volatile memory structure of claim 15, wherein a doping ratio of Zr of HfZrO is 30% to 70%,
   a doping ratio of Al of HfAlO is 2% to 12%,
   a doping ratio of Si of HfSiO is 2% to 5%,
   a doping ratio of Y of HfYO is 2% to 12%,
   a doping ratio of La of HfLaO is 3% to 6%,
   a doping ratio of Gd of HfGdO is 2% to 6%,
   a doping ratio of Sr of HfSrO is 2% to 6%,
   a doping ratio of Sm of HfSmO is 2% to 6%.

17. The manufacturing method of the three-dimensional non-volatile memory structure of claim 12, further comprising forming a conductive pillar inside the ferroelectric material pillar.

18. The manufacturing method of the three-dimensional non-volatile memory structure of claim 17, wherein a material of the conductive pillar comprises a metal compound.

19. The manufacturing method of the three-dimensional non-volatile memory structure of claim 18, wherein the metal compound comprises metal nitride or metal carbide.

20. The manufacturing method of the three-dimensional non-volatile memory structure of claim 19, wherein the metal compound comprises titanium nitride, tantalum nitride, tantalum carbon nitride, tungsten nitride, titanium tungsten nitride, titanium carbide, titanium aluminum carbide, tantalum carbide, tantalum aluminum carbide, or niobium aluminum carbide.

* * * * *